(12) United States Patent
Totzeck et al.

(10) Patent No.: US 7,286,284 B2
(45) Date of Patent: Oct. 23, 2007

(54) MICROSCOPE IMAGING SYSTEM AND METHOD FOR EMULATING A HIGH APERTURE IMAGING SYSTEM, PARTICULARLY FOR MASK INSPECTION

(75) Inventors: Michael Totzeck, Schwaebisch Gmuend (DE); Heiko Feldmann, Schwaebisch Gmuend (DE); Toralf Gruner, Aalen-Hofen (DE); Karl-Heinz Schuster, Koenigsbronn (DE); Joern Greif-Wuestenbecker, Jena (DE); Thomas Scheruebl, Jena (DE); Wolfgang Harnisch, Lehesten (DE); Norbert Rosenkranz, Reichenbach (DE); Ulrich Stroessner, Jena (DE)

(73) Assignee: Carl Zeiss SMS GmbH, Jena (DE)

( * ) Notice: Subject to any disclaimer, the term of this patent is extended or adjusted under 35 U.S.C. 154(b) by 349 days.

(21) Appl. No.: 10/917,626

(22) Filed: Aug. 13, 2004

(65) Prior Publication Data
US 2006/0012873 A1 Jan. 19, 2006

(30) Foreign Application Priority Data
Jul. 8, 2004 (DE) ...................... 10 2004 033 603

(51) Int. Cl.
*G02B 23/00* (2006.01)
(52) U.S. Cl. ...................... 359/363; 382/144; 382/149; 356/364; 359/900
(58) Field of Classification Search ...................... None
See application file for complete search history.

(56) References Cited

U.S. PATENT DOCUMENTS

| 5,890,095 | A * | 3/1999 | Barbour et al. ............... 702/40 |
| 6,741,356 | B1 * | 5/2004 | Ishiwata et al. ............ 356/491 |
| 7,023,546 | B1 * | 4/2006 | McMillan ................... 356/364 |

* cited by examiner

*Primary Examiner*—Stephone B. Allen
*Assistant Examiner*—Derek S. Chapel
(74) *Attorney, Agent, or Firm*—Reed Smith LLP

(57) ABSTRACT

An optical imaging system for inspection microscopes with which lithography masks can be checked for defects particularly through emulation of high-aperture scanner systems. The microscope imaging system for emulating high-aperture imaging systems comprises imaging optics, a detector and an evaluating unit, wherein polarizing optical elements are selectively arranged in the illumination beam path for generating different polarization states of the illumination beam and/or in the imaging beam path for selecting different polarization components of the imaging beam, an optical element with a polarization-dependent intensity attenuation function can be introduced into the imaging beam path, images of the mask and/or sample are received by the detector for differently polarized beam components and are conveyed to the evaluating unit for further processing.

34 Claims, 6 Drawing Sheets

MICROSCOPE IMAGING SYSTEM AND METHOD FOR EMULATING A HIGH APERTURE IMAGING SYSTEM, PARTICULARLY FOR MASK INSPECTION

CROSS-REFERENCE TO RELATED APPLICATION

This application claims priority of German Application No. 10 2004 033 603.2, filed Jul. 8, 2004.

BACKGROUND OF THE INVENTION a) Field of the Invention

The present invention is directed to an optical imaging system for inspection microscopes with which lithography masks can be checked for defects particularly through emulation of high-aperture scanner systems.

b) Description of the Related Art

As object structures continue to decrease in size, increasingly higher image-side numerical apertures of scanner systems are required. However, the incident angles which are therefore also increasingly greater result in vector effects, as they are called, in which tangentially polarized and radially polarized beam components have different intensity distributions. It has been shown that the beam components which oscillate parallel to the incident plane defined by the incidence direction and surface normal of the substrate (s-polarized) interfere better and accordingly generate a better contrast than the beam components oscillating perpendicular thereto (p-polarized). These vector effects lead to a decreasing contrast for p-polarized components of radiation and, therefore, to a decreasing total contrast in scanner systems with high image-side numerical apertures.

The following description is based on this definition: Light is a transverse electromagnetic wave whose field oscillates perpendicular to the propagation direction. Light whose field vector E oscillates in only one direction is called linearly polarized light. The polarization direction is the direction in which the field vector E oscillates. The incident beam and reflected beam define the incident plane lying perpendicular to the interface of the two media. Light whose polarization plane lies perpendicular to the incident plane is called s-polarized light and light whose polarization plane lies parallel to the incident plane is called p-polarized light.

Tangential (s-)polarization is present when the light in the pupil of an optical system is linearly polarized and the polarization direction changes along the pupil so that the polarization direction is tangential to the optical axis (perpendicular to the radius vector) at every point of the pupil. In contrast, radial (p-)polarization is present when the polarization direction is radial to the optical axis (parallel to the radius vector) at every point in the pupil.

The current direction of the semiconductor industry favors the use of immersion systems for producing wafer structures smaller than 65 nm. Image-side numerical apertures of NA>1 are achieved by applying an immersion liquid to the wafer, so that smaller structures can be generated at the same wavelength. Accordingly, at a wavelength of $\lambda$=193 nm and when using water as immersion liquid, a maximum numerical aperture of 1.4 can be reached. Even greater numerical apertures can be achieved through the use of different immersion liquids. Therefore, with a reduction factor of 1:4, wafer structures of 65 m and 45 nm are required for mask structures of 260 nm and 180 nm, respectively. Since the mask structures are therefore in the range of the imaging wavelength (193 nm), the polarization effects due to the masks are also increasingly dominant.

When imaging a lithography mask through scanner systems, these p-polarized beam components are imaged differently than they are through an inspection microscope. Due to the magnified imaging of the lithography mask on a CCD matrix, the image-side numerical aperture is extremely small, so that vector effects do not occur. When a microscope is used to inspect lithography masks by emulating a scanner system, the occurring vector effects are absolutely necessary for examining the lithography mask because a realistic image of the scanner system cannot otherwise be emulated.

In the inspection microscopes known from the prior art, vector effects were not taken into consideration because the numerical apertures of the imaging systems that were used were less than 1 and vector effects therefore led to a minor error.

Therefore, the analysis of defects in the mask production process is increasingly important with smaller structures. For the last ten years, AIMS™ (Aerial Imaging Measurement System) by Carl Zeiss SMS GmbH has been commercially available for the analysis of mask defects with respect to printability. For this purpose, a small area of the mask (defect location) is illuminated and imaged under the same conditions of illumination and imaging (wavelength, NA, sigma, polarization) as with the lithographic scanner. In contrast to the scanner, however, the aerial image generated by the mask is magnified on a CCD camera. The camera sees the same image as the resist on the wafer. Therefore, the aerial image can be analyzed without wasteful test prints. Additional information for the analysis of the lithographic process window is obtained by taking a focus series.

While the lithography scanner images the mask structure in a reduced manner on the medium to be exposed, the structure is imaged in a magnified manner on a detector in mask inspections. The mask-side numerical aperture is the same in both systems.

According to the prior art, the image-side differences between the scanner and the emulation microscope are minor. As the image-side numerical aperture of the scanner increases, this difference increases and can no longer be ignored. This effect occurring in scanner imaging is called the vector effect.

OBJECT AND SUMMARY OF THE INVENTION

It is the primary object of the present invention to develop a solution for lithography mask inspection microscopes for scanner emulation which makes it possible to emulate the images of scanner systems also with an image-side numerical aperture of greater than one.

According to the invention, this object is met by a microscope imaging system for emulating high aperture imaging systems, particularly for mask inspection, comprising imaging optics having an illumination beam path and an imaging beam path, a detector and an evaluating unit. At least one polarizing optical element is selectively arranged in the illumination beam path for generating determined polarization states of the illumination beam and/or in the imaging beam path for selecting determined polarization components of the imaging beam. An optical element with a polarization-dependent intensity attenuation function is capable of being introduced into the imaging beam path. Images of the mask and/or sample for polarized and/or unpolarized beam components are received by the detector and conveyed to the evaluating unit for further processing.

By means of the proposed solution, it is possible to examine lithography masks for defects in spite of increasingly smaller structures and increasingly higher image-side numerical apertures of the imaging systems by means of inspection microscopes with high magnifications. Realistic images of the stepper systems can be generated by emulating the occurring vector effects.

The proposed solution is also applicable in other optical systems in which the characteristics of high-aperture imaging optics are to be emulated by low-aperture imaging optics in order to observe and/or taken into account corresponding effects.

The invention will be described more fully in the following with reference to embodiment examples.

DESCRIPTION OF THE PREFERRED EMBODIMENTS

Figure 1:
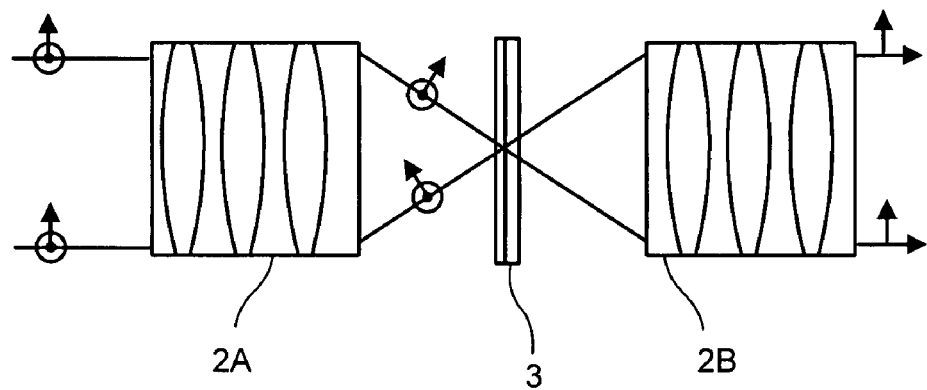
FIG. 1 shows an s-/p-beam splitter in a convergent beam path.

Imaging System for the Simulation of High-Aperture Scanner Systems

The microscope imaging system, according to the invention, for the emulation of high-aperture scanner systems, particularly for mask inspection, comprises illumination optics and imaging optics, a detector and an evaluating unit. Polarizing optical elements for generating different polarization states of the illumination beam are selectively arranged in the illumination beam path and/or in the imaging beam path for selecting different polarization components of the imaging beam. An optical element with a polarization-dependent intensity attenuation function can be introduced into the imaging beam path. Images of the mask and/or sample are received by the detector for differently polarized beam components. The images for differently polarized beam components are subsequently combined by an evaluating unit to form a total image. This is carried out, for example, by summing their intensity distributions.

Polarizing Optical Elements

The polarizing optical elements will be discussed more fully in the following. These polarizing optical elements can be arranged in the illumination beam for generating different polarization states as well as in the imaging beam path for selecting different polarization components.

In a first embodiment form, an optical component group comprising two lenses or lens groups with at least one polarizing film or layer positioned therebetween is used as polarizing optical element. In a particularly advantageous construction, the polarizing layer is constructed as an s-/p-beam splitter in a 2-f construction.

An s-/p-beam splitter is introduced between two lenses or other lens systems with a high numerical aperture. The two lenses are arranged in such a way that they form a 2-f construction. A convergent beam bundle with a defined first angular distribution is generated from the extensively parallel beam bundle through the first lens or lens group which has a positive refractive power in its entirety.

One or more s-/p-beam splitters, each comprising a plane-parallel, transparent plate oriented perpendicular to the optical axis and a polarization splitter layer arranged on the entrance side and/or exit side of the plate, are located between the two lenses or lens groups. The s-/p-beam splitter used in transmission has a practically negligible effect on the angular distribution of the radiation so that a beam bundle whose angular distribution corresponds substantially to the angular distribution after the first lens or lens group exits at its exit side.

An angle-changing second lens or lens group which transforms the arriving divergent beam bundle into an extensively parallel beam bundle by means of an overall positive refractive power is arranged at a distance behind the s-/p-beam splitter. The front focal plane of the second lens or lens group coincides with the back focal plane of the first lens or lens group so that a 2-f arrangement, as it is called, is formed overall. One or more s-/p-beam splitters are located between the lenses or lens groups.

The s-/p-beam splitters comprise a dielectric multilayer alternating-film system in which individual films or layers of high-refractive dielectric material and low-refractive dielectric material are arranged alternately one on top of the other. However, uncoated plates with a refractive index that is as high as possible can also be used. The reflection factor $R_p$ for p-polarized light and $R_s$ for s-polarized light differ at the interfaces of the layer system with non-perpendicular incident light such that, overall, one of the polarizing components is more transmissive and the other is more reflective.

In extreme cases, the s-polarized beam component can be reflected and the p-polarized beam component can be transmitted. In that case, only the p-polarized beam component would be in collimated form at the output of the second lens. When using an s-/p-beam splitter which transmits s-polarized beam components, only the s-polarized beam component would be in collimated form.

FIG. 1 shows an s-/p-beam splitter 3 in the convergent beam path in high-aperture in-coupling 2A and out-coupling optics 2B. The s-/p-beam splitter layer arranged on a planar substrate should be designed in such a way that a maximum polarizing action is achieved precisely in the range of high numerical apertures, i.e., in the range of large incident angles.

The same principle can also be used to generate a predominantly tangentially polarized output polarization state behind the out-coupling device 2B. For this purpose, an s-/p-beam splitter 3 is used which transmits s-polarized beam components to a greater degree than p-polarized beam components. In this case also, the reflection factors $R_s$ and $R_p$ are identical with perpendicular incident light; after that, however, different reflection factors result for s-polarized beam components and p-polarized beam components.

From a beam bundle that is unpolarized or that has a given spatial distribution of polarization states, an arrangement of the type mentioned above can generate a beam bundle with a spatial distribution of polarization states that differs from the first beam bundle. The s-/p-beam splitter is designed in such a way that it has a greater capability for transmitting p-polarized beam components than for transmitting s-polarized beam components. However, in other designs, it is also possible for the s-/p-beam splitter to have a greater capability for transmitting s-polarized beam components than for transmitting p-polarized beam components. Tangentially polarized radiation is particular can be generated in this way.

Angle-selective beam splitters with one or more polarizing layers generally require little space and can be realized, if necessary, by modifying existing optical components in an optical system. The s-/p-beam splitter with one or more polarizing layers can be constructed, for example, as a plane-parallel plate with an angular distribution that is substantially constant over the entire cross section.

In another embodiment form, the s-/p-beam splitter with one or more polarizing layers can be arranged on a convexly curved or concavely curved substrate surface. In this case, the angular distribution is a function of the location of or distance from the optical axis. The surface of a lens on which the marginal or edge beams impinge at high incident angles can be used as a curved substrate surface.

The beam splitter layer can also be arranged inhomogeneously for specifically adapting the radial shape of the beam influence to requirements.

When the optical system already has a high numerical aperture, the beam splitter layer can be arranged therein so that the lenses or lens groups are not required additionally.

Alternatively, a plate comprising an optically active medium that leads to a rotation of the polarization state depending on its thickness can be arranged in front of the s-/p-beam splitter. When the thickness is so selected that a rotation of 90° is carried out, the p-polarized beam component, for example, in front of the s-/p-beam splitter is changed into an s-polarized beam component and transmitted. The intensity of the illumination beam can be substantially increased in this way. Behind the s-/p-beam splitter, the conversion can be canceled by a second optically active plate. It is also possible to use two lambda/2 retardation plates which are rotated relative to one another by 45° instead of a plate comprising an optically active medium.

It would also be advantageous to provide different beam splitters which either transmit p-polarized beam components or s-polarized beam components and to arrange them in such a way that they can be introduced into the beam path if needed.

In another variation, individual positive meniscus lenses with extensively corrected spherical aberration are used so that the collimated beam is transformed into a spherical wave converging toward the focus and the spherical wave which diverges again behind the focus is transformed again into an axially parallel beam bundle. In order to minimize the radiation load on the s-/p-beam splitter, the latter should lie in front of or behind the in-coupling and out-coupling optics rather than in the focus of the latter. The transmitted wave is invariant with respect to an axially parallel displacement of the s-/p-beam splitter. However, since the reflected radiation is not changed by a displacement of this kind, the focus of the reflected wave can be used, for example, to block or couple out the reflected radiation in a deliberate manner. In this connection, it is advantageous to move the s-/p-beam splitter in front of the focus and to arrange a diaphragm blocking the occurring scatter radiation in the focus itself While s-polarized or p-polarized beam components are transmitted when radiation with a spherical wavefront impinges on the s-/p-beam splitter, general polarization states can also be generated with aspherically shaped wavefronts.

Figure 2:
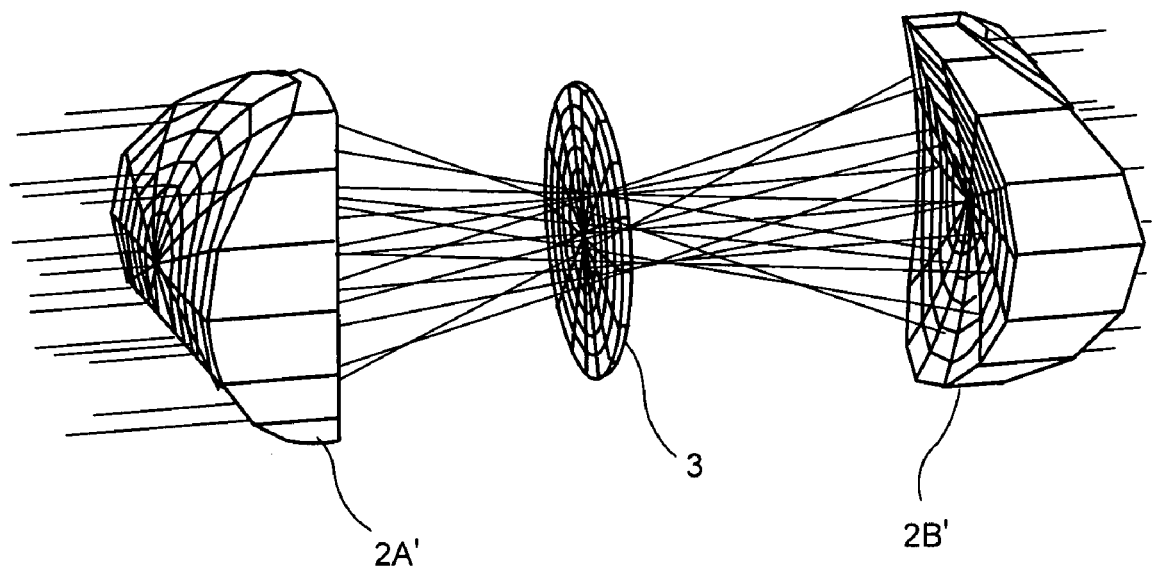
FIG. 2 shows the beam path of an s-/p-beam splitter between two cylindrical lenses.

In this connection, FIG. 2 shows the beam path with an s-/p-beam splitter 3 between two cylindrical lenses 2'. A cylindrical lens 2' generates a linear polarization that increases transverse to the cylinder axis.

By means of rotationally symmetric aspherical lenses, the relationships between the beam height in front of the in-coupling optics and the incident angle on the s-/p-beam splitter layer can be varied and the radial path of the polarization can be controlled.

If, for example, lenses with spherical lens surfaces are used exclusively for the s-/p-beam splitter in the 2-f construction so that the first beam bundle falling on the beam splitter has a spherical phase front, radially or tangentially polarized radiation which, in particular, is cylindrically symmetric can be generated in this way. For example, cylindrical lenses and/or rotationally symmetric aspherical lenses can be provided for this purpose.

In order that the optical arrangement which is outfitted with the polarizer device can be used selectively with or without influencing polarization, it is provided in preferred embodiment forms to make the polarization influencing device exchangeable in such a way that it can be selectively added to the beam path or removed from the beam path. A changer device which, as the case may be, can be an integral part of a manipulating device can be provided for this purpose.

In order to optimize the polarization state of the transmitted beam components, the s-/p-beam splitter should be arranged so as to be tiltable and/or displaceable relative to the optical axis in order that the point at which the beam strikes perpendicularly and at which, therefore, no polarization effect is to be expected can be displaced within the pupil.

The s-/p-beam splitter can be designed in such a way that the distribution of the polarization of the exiting beam is determined exclusively by the characteristics of the angle-selective layers that influence polarization in order to adjust radial or tangential polarization, for example. However, it is also possible to modify the polarization distribution by means of at least one other device which influences polarization. For example, a polarization rotator can be provided in order to rotate the privileged polarization directions behind the s-/p-beam splitter. Accordingly, a rotator causing a rotation of 90° can change a radially polarized distribution into a tangentially polarized distribution (or vice versa). For example, a plate comprising an optically active material which is arranged behind the s-/p-beam splitter and can be exchangeable can be used as a polarization rotator.

In the embodiment forms, the principle explained herein through a few examples consists in converting a desired distribution of the linear polarization in the pupil into an angular distribution and then transforming this into a polarization distribution through a polarization-changing layer, particularly an s-/p-beam splitter layer. The symmetry of the angular distribution then determines the symmetry of the polarization distribution.

In another advantageous construction, the s-/p-beam splitter is arranged at a point in the beam path at which there is a high numerical aperture in any case, for example, between the object and microscope objective or between a condenser and object.

Further, the arrangement of the s-/p-beam splitter outside a focus has the advantage that the various pupil locations are characterized not only by different incident angles but also by different distances from the optical axis. The beams can be influenced deliberately by varying the beam splitter layer over the surface.

Further, it is advantageous to arrange the s-/p-beam splitter on a convexly curved or concavely curved optical surface, e.g., a lens surface of the objective or condenser near the pupil, instead of on a plane surface. On the one hand, it is no longer necessary to form a high numerical aperture and, on the other hand, the curvature can be made use of, for example, to apply an inhomogeneous beam splitter layer.

The polarizing optical element described in a second embodiment form serves to generate s-polarized beam components from p-polarized radiation, or vice versa. The polarizing optical element which preferably comprises a plane plate of optically active material is arranged in the imaging beam path and generates an integral rotation of the polarization direction by $(2n+1)*90°$ depending on its thickness.

For the solutions described above, it is usually necessary to generate the s-polarized beam components and p-polarized beam components separately. While the p-polarized beam components can be generated substantially easier and with a higher degree of polarization, it is precisely s-polarized beam components that are needed for many applications.

With the polarizing optical element described above, p-polarized beam components are transformed into s-polarized beam components. For this purpose, a plane plate of optically active material is arranged behind a p-polarizer and a rotation of the polarization direction is carried out depending on its thickness. This plane plate which is made of optically active quartz, for example, is dimensioned in such a way that an integral rotation of the polarization direction by $(2n+1)*90°$ is carried out. The direction of rotation is not relevant in this connection.

In order to select the s-polarized beam component from unpolarized radiation, a p-polarizer is arranged between two optically active plane plates of the kind just described. The first plane plate exchanges the s-polarized and p-polarized beam components, the p-polarizer transmits the p-polarized beam components and the second plane plate converts the p-polarized beam components into s-polarized beam components. In contrast to an s-polarizer, the degree of polarization can be substantially improved. In principle, these two arrangements can also be used in the opposite sense, i.e., to generate p-polarized beam components.

Optical Element with Polarization-Dependent Intensity Attenuation Function

The optical element with polarization-dependent intensity attenuation function which is arranged in the pupil plane of the imaging optics or at least near the pupil will now be discussed more fully. As was already mentioned, illumination and imaging are carried out under the same conditions as in the lithographic scanner system.

While the object-side numerical aperture can be identical in a scanner system and in an inspection microscope, the image-side numerical aperture (NA) of the two systems differs by a factor of 400, for example. Starting from an object-side NA of 0.35, the image-side NA is, e.g., 1.4 in a scanner system and 0.0035 in an inspection microscope. Therefore, vector effects do not occur in inspection microscopes.

According to traditional imaging theory, the intensity distributions should be identical because of the identical active object-side numerical aperture. Of course, this applies only for the maxima; but considerable differences are observed in the intermediate distributions and particularly in the minima. These misrepresentations result when the actions of a lithography mask are examined by means of an inspection microscope.

Steadily decreasing object structure sizes require imaging systems with increasingly higher image-side numerical apertures. The vector effects occurring as a result of the large angles in imaging lead to misrepresentations in the simulation of scanner systems by means of inspection microscopes.

Figure 3:
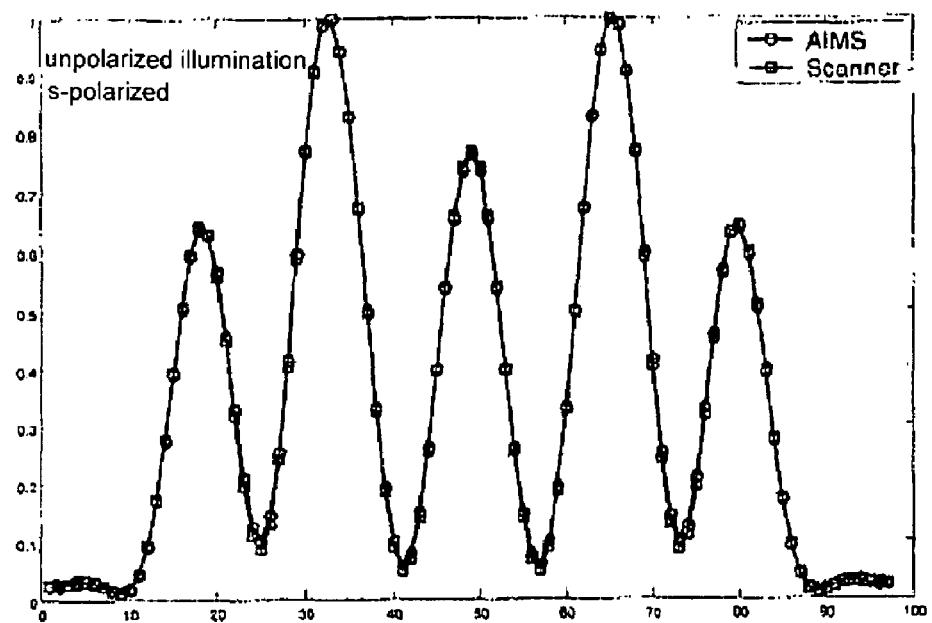
FIG. 3 shows a comparison of the normalized or scaled intensity distributions of the s-polarized and p-polarized beam components in a scanner system and in an inspection microscope.
Figure 3:
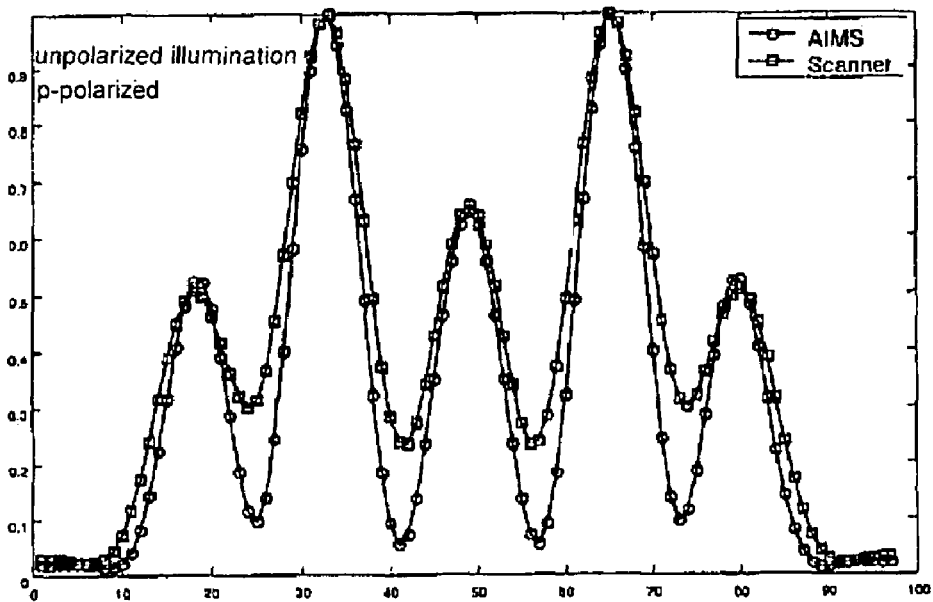

In this connection, FIG. 3 shows the normalized intensity distributions of the s-polarized and p-polarized beam components in a scanner system and in an inspection microscope. While the normalized intensity curves of the s-polarized beam components still coincide, the p-polarized beam components show considerable deviations. It can also be seen that the vector effects lead to a loss of contrast or to a loss of resolution.

Figure 4:
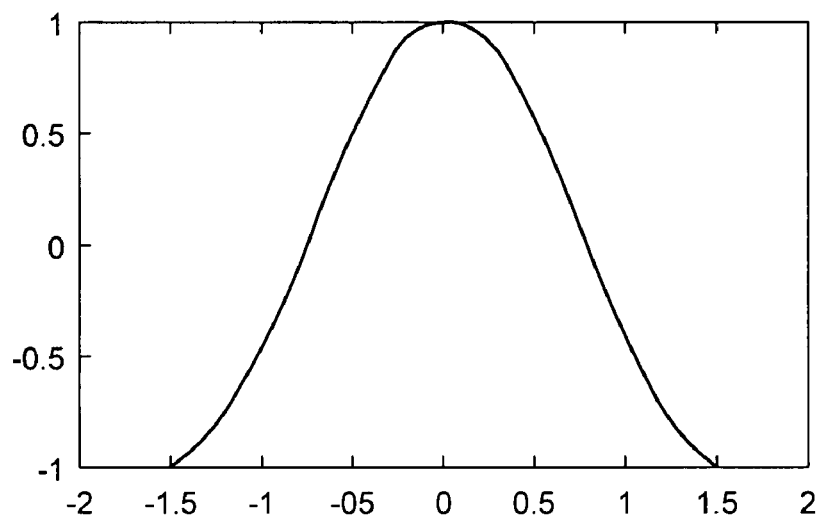
FIG. 4 shows the angle-dependent weighting of the beam components contributing to image generation.

Due to the vector effects, the large incident angles resulting in the scanner system from the high image-side NA lead to an angle-dependent weighting of the beam components contributing to the image generation. FIG. 4 shows the curve of an angle-dependent weighting which can be described in a first approximation as a function $\cos 2\theta$, where $\theta$ corresponds to half of the aperture angle of the imaging objective of the scanner system.

Two images of the mask and/or sample are taken successively. While a p-polarizer is introduced into the imaging beam path together with the optical element with polarization-dependent intensity attenuation function for the first image, only an s-polarizer is required in the imaging beam path for the second image.

Figure 5:
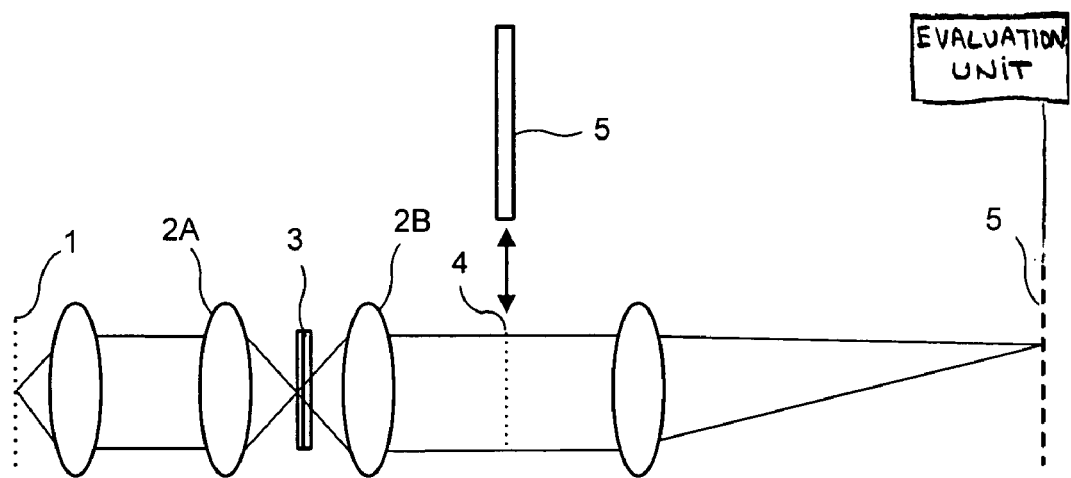
FIG. 5 shows a microscope imaging system with an optical element which attenuates the intensity.

In this connection, FIG. 5 shows the imaging system of an inspection microscope for examining lithography masks.

The s-polarized and p-polarized beam components coming from the mask and/or sample 1 are imaged successively on a detector 6 by imaging optics 2 and are evaluated by an evaluating unit. An optical element 5 with an intensity-attenuating action symmetric to the optical axis is provided in the pupil plane 4 of the imaging optics 2 or at least near the pupil. The numerical aperture of the imaging optics 2 should be greater than 0.2, particularly greater than 0.5. This optical element 5 is introduced into the imaging beam path only for detecting the p-polarized beam components. The detector 6 accordingly receives an image of the mask and/or sample 1, each for s-polarized and for p-polarized beam components. These two images of the mask and/or sample 1 are joined by the evaluating unit by summing the intensity distributions to form a total image. The imaging optics 2, with the s-/p-beam splitter layer 3 arranged therebetween, form a 2-f construction. The rotationally symmetric, intensity-attenuating action of the optical element 5 corresponds to the angle-dependent weighting of the beam components contributing to the image generation, which angle-dependent weighting results from the vector effects, and is given in a close approximation by:

$$I_{red}=I*\cos 2\theta.$$

In a particularly advantageous construction, the optical element 5 arranged in the imaging beam path is constructed in such a way that the s-polarized beam components are not attenuated and the p-polarized beam components are attenuated corresponding to the condition described above. Only an image of the mask and/or sample 1 containing the simulated vector effects for the p-polarized beam components is received by the detector. A separate illumination with s-polarized radiation and p-polarized radiation is not required for this purpose. Further, the optical element 5 can remain in the beam path. In this case, the optical element 5 arranged in the imaging beam path is a partial polarizer with a polarization-dependent and angle-dependent intensity attenuation function.

The optical element 5 can be constructed, for example, as a diffractive optical element. It should advantageously be rotatable and/or displaceable along the optical axis for selectively inserting into the beam path.

In order to optimize the intensity-attenuating action of the optical element 6, the latter should be arranged so as to be tiltable so that the point at which the radiation impinges perpendicularly and at which, therefore, no polarization effect is to be expected can be displaced within the pupil.

The images of the mask and/or sample received by the detector for illumination with differently polarized radiation are conveyed to the evaluating unit for further processing. The images of the mask and/or sample received for differently polarized radiation are combined by the evaluating unit, e.g., a computer unit, to form a total image by summing the intensity distributions.

Method for Emulating High-Aperture Scanner Systems

In the method, according to the invention, for emulating high-aperture imaging systems, e.g., scanner systems, in a microscope imaging system particularly for mask inspection, the polarization characteristics of the images of the mask and/or sample are determined in that a quantity of differently polarized images are recorded, the degree and the direction of polarization is determined therefrom for all segments of the image, the images are subjected to a polarization-dependent weighting of their intensity distribution and are combined to form a total image containing information about the intensity and the polarization characteristics.

For this purpose, polarizing optical elements are selectively arranged in the illumination beam path and/or in the imaging beam path. In the illumination beam path, these polarizing optical elements are used to generate different polarization states of the illumination beam path corresponding to the illumination conditions and imaging conditions of a lithography scanner system or another high-aperture imaging system. In contrast, they are used in the imaging beam path to generate differently polarized images of the mask and/or sample. Differently polarized images of the mask can also be measured by illuminating them with different polarizations.

Determination of the Degree and Direction of Polarization

One or more polarization-optical elements, e.g., a linear polarizer, is/are arranged so as to be rotatable in the illumination beam path and/or imaging beam path for recording a quantity of differently polarized images of the mask and/or sample. This polarization optical element is rotated in at least three angular positions so that at least one image can be received in every angular position by the detector. For example, an image is received for the angular position of the linear polarizer of 0°, 45°, 90° and 135°. An image offset that may be caused by the polarizer can be measured and corrected by adjustment or by means of hardware or software. In order to be able to compensate for influences of the polarizer on the image quality, it is advantageous to record an unpolarized image, i.e., without the linear polarizer, in addition.

Recording of the images of the mask and/or sample with and without a polarizing optical element can be carried out at different distances from the focal plane. While the recording of the image or images with polarizing optical elements is carried out in the focal plane, the image is recorded without a polarizing optical element in several planes in front of and/or in and/or behind the focal plane. The images obtained in this way with polarizing optical elements form the basis for calculating all of the images without a polarizing optical element. Within a certain range, the degree and direction of polarization does not depend on whether or not the images of the mask and/or sample are obtained in front of, in, or behind the focus position.

The degree and direction of polarization determined from these images for a plurality of pixels of the detector are preferably displayed as a Jones vector, Stokes vector or polarization matrix.

The polarization matrix, for example, is defined as:

$$P = \begin{bmatrix} P_{xx} & P_{xy} \\ P_{yx} & P_{yy} \end{bmatrix} = \begin{bmatrix} \langle |A_x(t)|^2 \rangle & \langle A_x(t)A_y^*(t)e^{i[\Phi(t)-\Psi(t)]} \rangle \\ \langle A_x^*(t)A_y(t)e^{-i[\Phi(t)-\Psi(t)]} \rangle & \langle |A_x(t)|^2 \rangle \end{bmatrix}.$$

This polarization matrix comprising four elements forms the basis for the emulation of vector effects in the AIMS. Different methods of polarization-dependent weighting of the intensity distributions of the images (emulation of vector effects) will be discussed in the following.

In an advantageous embodiment, the determination of the polarization characteristics of the image and the determination of the degree and direction of polarization for different pixels of the detector can be dispensed with assuming that the polarization characteristics of the image correspond to those of the illumination. Of course, the polarization characteristics of the illumination must be known for this purpose. This simplification provides sufficient accuracy particularly for simple mask structures.

Displacement Methods

Contrast in the image occurs by means of the interference of at least two orders of diffraction whose angle of incidence is θx in x-direction and θy in y-direction. For x-polarized light, a phase delay of η=+θx or −θx must be generated proceeding from the vector effects to be emulated in the pupil of the inspection microscope:

$$I_{x+}=E_0^2+E_1^2+E_0E_1 \cos(\phi+\Delta\theta x)$$

and $$I_{x-}=E_0^2+E_1^2+E_0E_1 \cos(\phi-\Delta\theta x),$$

where $\phi$ is the phase difference between $E_0$ and $E_1$. This corresponds in a sufficient approximation to a displacement of the image by a determined amount D in the +/−x-direction.

Adding the two images and dividing by 2 gives:

$$I=(I_{x+}+I_{x-})/2=E_0^2+E_1^2+E_0E_1 \cos\phi \cos\Delta\theta x.$$

The weighted intensity distribution $I_x$ emulates the above-mentioned vector effects in sufficient approximation.

A partially polarized state can be described as an incoherent sum of two orthogonal polarization states. Accordingly, the intensity function for every pixel of the detector is also divided into a first image whose field vector E extends parallel to the polarization direction and a second image whose field vector E extends perpendicular thereto. The conditions for the two field vectors are as follows:

E parallel to the polarization direction:

$I_\square = (1+g)/2 * I_{ges}$

E perpendicular to the polarization direction:

$I_\perp = (1-g)/2 * I_{ges}$, where g defines the degree of polarization.

In this method, the image is subjected in a polarization-dependent manner to a weighting of its intensity distribution in that the portion $I_\square$ of the image of the mask and/or sample is displaced as an intensity function in the direction of the determined polarization direction by an amount ±D. In a corresponding manner, the portion $I_\perp$ of the image of the mask and/or sample is displaced perpendicular to the direction of the determined polarization direction by an amount ±D and these four intensity values are summed. The division of the intensity of the image into different portions is carried out in a polarization-dependent manner in a ratio of 1+g to 1−g, where g is the degree of linear polarization.

At least two portions of the intensity are preferably displaced in different directions. The displacement directions lie at least partially parallel and/or perpendicular to the direction of polarization.

Figure 6:
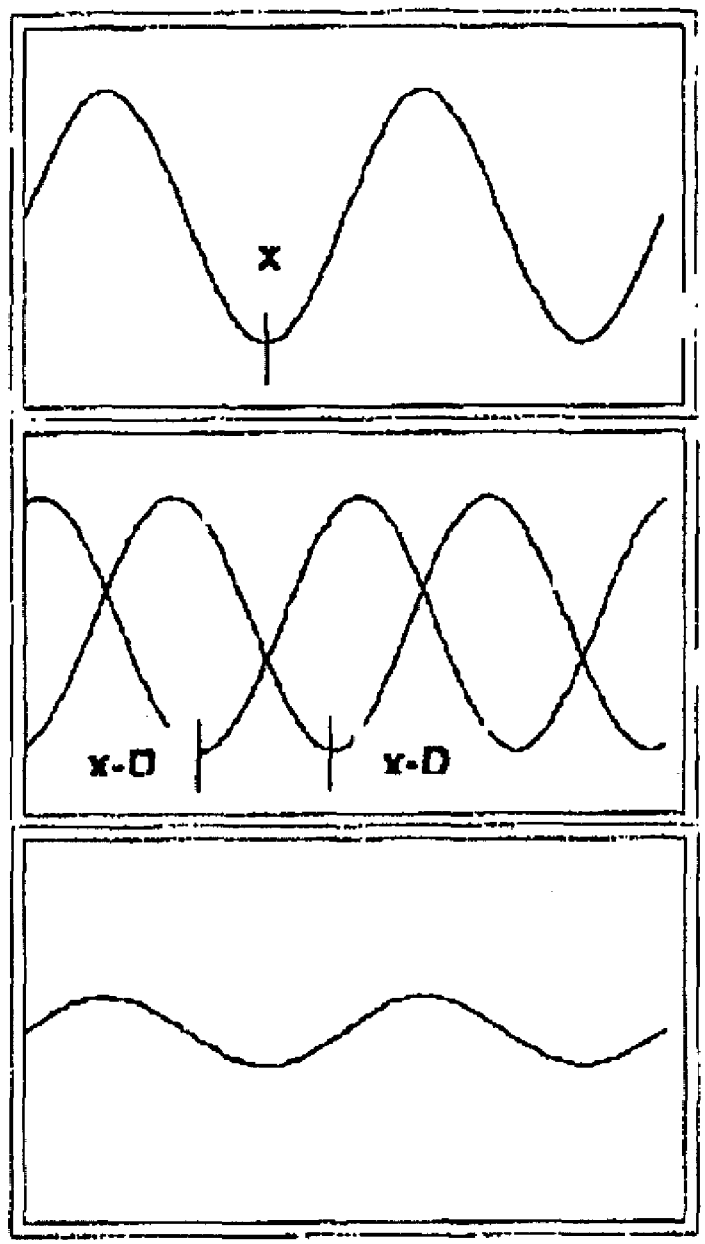
FIG. 6 is a graph showing the summing of offset images.

FIG. 6 shows a diagram for illustrating the summing of the images that are offset by D. By displacing an image and subsequently summing the images, a loss in contrast caused by the vector effect is emulated.

The images are subjected in a polarization-dependent manner to a weighting of their intensity distribution in that the image of the mask and/or sample as an intensity function is shifted in the direction of the determined polarization direction by an amount ±D on the one hand and perpendicular to the determined polarization direction by an amount ±D on the other hand.

The amount D can be selected, for example, as:

$$D = \frac{\lambda}{n_{Lack}} \frac{1}{4\sqrt{2}} \cdot \frac{c \cdot NA/n_{Lack}/\arcsin(c \cdot NA/n_{Lack})}{1/\sqrt{2}/\arcsin(1/\sqrt{2})},$$

where c is a constant $\leq 1$, e.g., c=0.9. This applies to the imaging system to be emulated. In the inspection microscope, D must be scaled by the ratio of the magnification factors of the two systems.

Consider, for example, a pixel of the detector at the location (x, y) at which the image is polarized in x-direction with a linear degree of polarization of g. This gives the corrected image:

$$I_{corrected} = \frac{I(x+D, y) + I(x-D, y)}{2} \cdot \frac{1+g}{2} + \frac{I(x, y+D) + I(x, y-D)}{2} \cdot \frac{1-g}{2}.$$

For polarization directions which do not lie parallel to the x-axis and y-axis, the displacement direction is calculated in a corresponding manner.

Consider, for example, a pixel of the detector at the location (x, y) at which the image is polarized in direction φ with a linear degree of polarization of g. This gives the corrected image:

$$I_{corrected} = \frac{1+g}{2} \cdot \frac{I(x + D\cos(\varphi)x, y + D\sin(\varphi)) + I(x - D\cos(\varphi), y - D\sin(\varphi))}{2} + \frac{1-g}{2} \cdot \frac{I(x - D\sin(\varphi), y + D\cos(\varphi)) + I(x - D\sin(\varphi), y - D\cos(\varphi))}{2}.$$

The images of the mask and/or sample in positions (x+D, y), (x−D, y), (x, y+D) and (x, y−D) are summed with or without weighting, where x and y are two determined directions or any directions orthogonal to one another.

For a polarization direction which does not lie parallel to the coordinate axes, the displacement direction is given in a corresponding manner. When the polarization state changes over the image, the displacement directions also change over the image field. Accordingly, the vector effects are emulated with sufficient accuracy.

In order to exclude influences of the polarizer on image quality, the intensity can be taken from an image that was recorded without a polarizer. The images with a polarizer then serve to determine the polarization characteristics.

The polarization characteristics can also be measured in another plane than the intensity. For example, the polarization characteristics can be measured in the focal plane and the unpolarized intensity can be measured in a plurality of planes in front of, in and behind the focal plane.

At the expense of limited accuracy, polarization measurement can be replaced by the assumption that the mask or sample does not act in a polarizing manner, that is, that the polarization of the image is identical to the polarization of the illumination and is therefore constant over the entire image.

Vector Effects in Fourier Space

In this first method in Fourier space for emulating high-aperture scanner systems in a microscope imaging system, the image is subjected in a polarization-dependent manner to a weighting of its intensity distribution in that, for all elements of the polarization matrix, Stokes vector, Jones vector, the intensities recorded with different polarization or other polarization-optical description of the image for different pixels of the detector, a two-dimensional Fourier transformation is carried out, a polarization-dependent attenuation factor is calculated, and a two-dimensional inverse Fourier transformation is carried out.

Every Fourier component corresponds to a spatial frequency occurring in the image. Accordingly, the degree and direction of the linear or total polarization is obtained for every Fourier component. The Fourier transform of the image is not identical to the intensity distribution in the pupil.

In this second method in Fourier space for the emulation of high-aperture scanner systems in a microscope imaging system, there is a different procedure for determining the pupil distribution, i.e., the Fourier components.

A method that has already been described many times is the measurement of the intensity distribution in the pupil by means of Bertrand optics and subsequent reconstruction of the image. When measuring the intensity distribution in the pupil, no information is obtained about the phase relationship between the individual Fourier components. In addition, higher orders of diffraction which contribute substantially to the fine structuring of the image are difficult to detect because of their low intensity.

Therefore, it is suggested to reconstruct a pupil distribution from the image. The pupil reconstruction is not clear-cut, i.e., different pupil distributions (intensity and phase) can generate one and the same image. In the procedure described herein to take into account the vector effects, only a reasonably small error is made in taking the vector effect into account when the pupil distribution is not correct but still allows the image to be correctly reconstructed.

When the pupil size is compared to the Fourier component distribution occurring when the image is Fourier-transformed, some Fourier components lie outside the pupil size in critical structures (structures at the limit of resolution), so that this direct approach of Fourier transformation does not lead to the desired pupil distribution, since all Fourier components must lie inside the pupil size. However, these Fourier components are suitable as starting values for a recursive optimization. In the optimization loop, the Fourier components (intensity and phase) are varied and the image is subsequently reconstructed and compared to the true image. When the difference between the true image and reconstructed image is below a selected value, the resulting pupil distribution can be used for further calculation. When a polarized image, rather than an unpolarized image, is used as a basis for this procedure, the individual polarization states of the Fourier component scan be determined in this way.

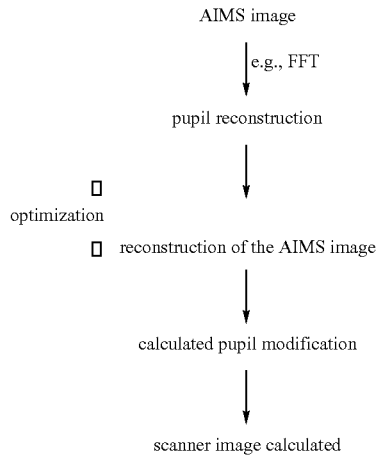

The emulation of the vector effects is now carried out by means of a pupil procedure, e.g., by multiplying by a spatial frequency-dependent and polarization-dependent attenuation factor of the individual Fourier components in the pupil. This attenuation factor is determined, among others, by the angle between the spatial frequency vector and the polarization direction. Subsequently, a new image is reconstructed with this modified pupil distribution.

Another possibility consists in carrying out the weighting by means of the convolution of a suitable function in real space instead of by multiplying by an attenuation function in Fourier space. The inverse Fourier transform of the attenuation function in Fourier space is a suitable function for this purpose.

A given spatial frequency in the image is generated by at least two orders of diffraction in the pupil. The orders of diffraction at points $v_1$ and $v_2$ have a vectorial distance $\Delta v$ and the mean coordinate $v_0$. Based on the condition that $v_1$ and $v_2$ must lie in the pupil, $v_0$ must lie within a determined range. The smaller $\Delta v$, the greater this range must be.

For every spatial frequency or Fourier component, the loss in contrast caused by the vector effect is calculated as a function of $v_0$. The attenuation factor is determined by the angle between the spatial frequency vector and the polarization direction and/or by the amount of the spatial frequency vector and is dependent, among other things, upon the cosine of the angle enclosed by the three-dimensional E field vectors in the image space of the high-aperture system. When there is more than one possible value of the attenuation factor for different possible values of $v_0$, a weighted or unweighted average, the median, the mean value between the smallest and largest value, or some other value within the possible area of variation is formed. In an advantageous embodiment, the weighting function is formed by taking into account the degree of coherence, the illumination setting and/or the polarization of the illumination.

In this method, partially polarized Fourier components are split into a plurality of differently polarized portions and the attenuation factor is calculated individually for the portions.

When a Fourier component is partially polarized, it is divided into a polarized and an unpolarized portion. The unpolarized portion is considered to be 50% x-polarized and 50% y-polarized without a phase relation. The Fourier component can also be split into a portion that is parallel to the polarization direction $F_\Box = (1+g)/2 * F_{ges}$ and a portion that is perpendicular to the polarization direction $F_\perp = (1-g)/2 * F_{ges}$, where g defines the degree of polarization. The multiplication factor $\tau$ is then calculated separately for each of the portions.

In an advantageous method, the polarization characteristics are determined by recording one or more images with polarization-optical components in the illumination beam path and/or imaging beam path and the intensity is determined by recording without polarization-optical components in the illumination beam path and/or imaging beam path. The images of the mask and/or sample with and without a polarizing optical element are calculated together in Fourier space.

The polarization characteristics can also be measured in a different plane than the intensity. For example, the polarization characteristics can be measured in the focal plane and the unpolarized intensity can be measured in a plurality of planes in front of, in and behind the focal plane.

A total image is formed by image reconstruction, e.g., an inverse Fourier transformation of at least one component of the polarization-optical description and/or total intensity.

Vector Effects by Convolution with the Difference of Two Point Images

In this third method for emulating high-aperture scanner systems in a microscope imaging system, the image is subjected in a polarization-dependent manner to a weighting of its intensity distribution in that the image of the mask and/or sample is subjected to a spatial convolution with a normalized point image for every pixel of the detector.

The intensity distribution occurring when imaging a point will be referred to hereinafter as point image. In this connection, the point image formed in an image-side high-aperture system is different than that in an inspection microscope due to the vector effect.

Normalized point image refers to the function with which the point image of the inspection microscope must be convoluted in order to obtain the point image of the high-aperture system. This is obtained by means of an inverse convolution of the high-aperture point image with the point image of the inspection microscope.

Figure 7:
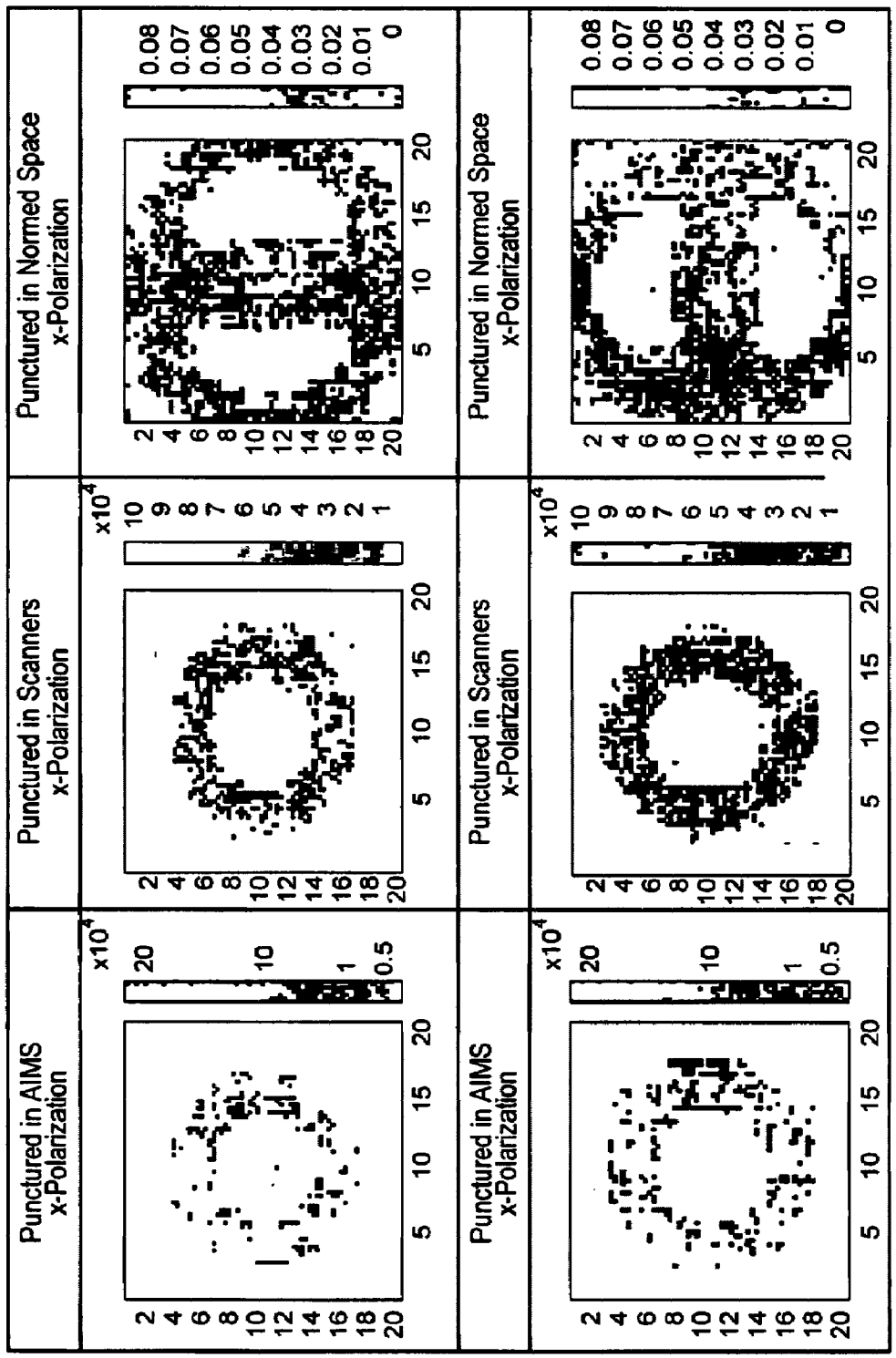
FIG. 7 is a diagram showing the determination of normalized point images for s-polarized and p-polarized beam components.
Figure 8:
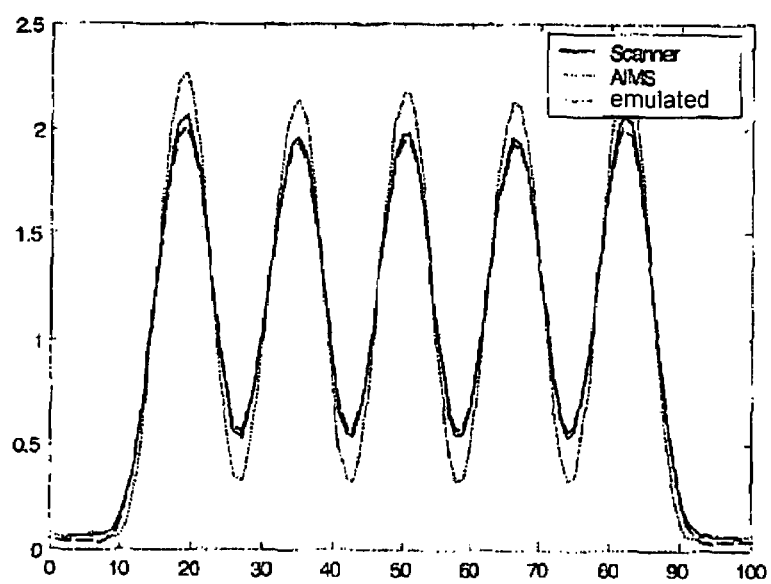
FIG. 8 shows an emulated intensity distribution for p-polarized beam components compared to those in the AIMS and in a scanner.

FIG. 7 shows the point images and the corresponding normalized point images for s-polarized and p-polarized beam components. The spatial convolution of the image of the mask and/or sample with the normalized point image is carried out for every pixel of the detector separately for horizontally and vertically polarized beam components. Instead of this, the beam component can also be divided into a portion whose E field is parallel to the spatial polarization direction and a portion orthogonal thereto. The intensities are then divided in a ratio of 1+g to 1−g, where g is the degree of polarization.

The point image of the scanner is determined empirically or theoretically. For this method, it is desirable that the point images of a scanner are known for all field points. A partially polarized state can be described as the incoherent sum of two orthogonal polarization states. In every pixel, let the polarization matrix P(x, y) be:

$$P = \begin{bmatrix} P_{xx} & P_{xy} \\ P_{yx} & P_{yy} \end{bmatrix} = \begin{bmatrix} \langle |A_x(t)|^2 \rangle & \langle A_x(t) A_y^*(t) e^{i[\Phi(t)-\Psi(t)]} \rangle \\ \langle A_x^*(t) A_y(t) e^{-i[\Phi(t)-\Psi(t)]} \rangle & \langle |A_x(t)|^2 \rangle \end{bmatrix}.$$

with the associated degree of polarization:

$$g(x, y) = \sqrt{1 - \frac{4 \det P(x, y)}{Sp^2 P(x, y)}}.$$

The polarized portion:

$$P^{pol}(x, y) = P(x, y) - \frac{SpP(x, y)}{2}(1 - g(x, y))I$$

can be calculated from the given polarization matrix and gives the field $E_1(x, y)$:

$$\vec{E}_1(x, y) = \begin{pmatrix} E_x \\ E_y \end{pmatrix} = \begin{pmatrix} \sqrt{p_{xx}^{pol}} \, e^{-i\Psi/2} \\ \sqrt{p_{yy}^{pol}} \, e^{i\Psi/2} \end{pmatrix}$$

and the field $E_2(x,y)$ orthogonal hereto:

$$\vec{E}_2(x, y) = \begin{pmatrix} -E_y^* \\ E_x^* \end{pmatrix} = \begin{pmatrix} -\sqrt{p_{yy}^{pol}} \, e^{-i\Psi/2} \\ \sqrt{p_{xx}^{pol}} \, e^{i\Psi/2} \end{pmatrix}$$

with the phase angle $$\psi(x,y) = \arg(P_{xy}^{pol})$$

and the matrix elements:

$$P_{xx}^{pol} = P_{xx} - \frac{P_{xx}+P_{yy}}{2}(1-g) = \frac{P_{xx}}{2}(g+1) + \frac{P_{yy}}{2}(g-1)$$

$$P_{yy}^{pol} = P_{yy} - \frac{P_{xx}+P_{yy}}{2}(1-g) = \frac{P_{xx}}{2}(g-1) + \frac{P_{yy}}{2}(g+1)$$

$$P_{xy}^{pol} = P_{xy}$$

While $|E_2|=0$ in the completely polarized case, the condition $|E_1|=|E_2|$ applies in the completely unpolarized case. In the partially polarized case, the ratio of the intensities of $E_1$ and $E_2$ is $$\frac{I_2}{I_1} = \frac{1-g}{1+g}.$$

Accordingly, the polarization state described by the polarization matrix P is composed of $$\sqrt{\frac{1+g}{2}}$$

from $E_1$ and $$\sqrt{\frac{1-g}{2}}$$

from $E_2$.

Accordingly, the point image of a scanner is also composed of these parts of the point images of the two orthogonal portions.

In accordance with the methods that were already described above, the convolution of the image of the mask and/or sample is carried out separately for a plurality of pixels of the detector with the normalized point image likewise for differently polarized beam components. The convolution is carried out, for example, for two portions of the intensity of the image, wherein the division into different portions is carried out in a polarization-dependent manner and one portion is at least partially parallel and/or perpendicular to the direction of polarization.

The images are subjected in a polarization-dependent manner to a weighting of their intensity distribution in that the image of the mask and/or sample as an intensity function is convoluted in the direction of the determined polarization direction by an amount ±D on the one hand and perpendicular to the determined polarization direction by an amount ±D on the other hand, wherein the amount D corresponds, for example, to the following condition:

$$D = \frac{\lambda}{n_{Lack} 4\sqrt{2}} \cdot \frac{NA/n_{Lack}/\arcsin(NA/n_{Lack})}{1/\sqrt{2}/\arcsin(1/\sqrt{2})},$$

where c=constant≦1.

The images of the mask and/or sample that are obtained in positions (x+D, y), (x−D, y), (x, y+D) and (x, y−D) are summed with or without weighting, where x and y are two determined directions or any directions orthogonal to one another.

The images for differently polarized beam components are combined by the evaluating unit by summing the intensity distributions to form a total image. Images for differently polarized beam components can be subjected to a weighting of the intensity distribution beforehand.

The evaluation of the images is carried out while taking into account the polarization characteristics so that vector effects are taken into account at least partially.

With the solution according to the invention, it is possible to examine lithography masks for defects by means of inspection microscopes with large magnifications in spite of increasingly smaller structures and increasingly higher numerical apertures of imaging systems. Realistic images of the scanner systems can be generated by emulation in spite of occurring vector effects.

Even scanner systems which use immersion optics, for example, and therefore achieve an optional image-side NA of, e.g., 1.6, can be emulated with the proposed microscope imaging system.

It is also possible to use the inventive solution within a microscope. For example, the in-coupling device and the out-coupling device can be designed in such a way that they can be installed inside a tube lens of a microscope or can be used as a tube lens. The polarization influencing arrangement can then be provided in the area of an intermediate image inside the tube lens. The polarization influencing arrangement should be exchangeable so that different polarization states can be realized.

While the foregoing description and drawings represent the present invention, it will be obvious to those skilled in the art that various changes may be made therein without departing from the true spirit and scope of the present invention.

The invention claimed is:

1. A method for emulation of high-aperture imaging systems, particularly for mask inspection, comprising the steps of:
providing imaging optics, a detector and an evaluating unit, in which different polarization states of an illumination beam or imaging beam can be selectively generated in an illumination beam path or in an imaging beam path;
determining the polarization characteristics of an image in that at least one image of a mask or sample made with or without a polarization-optical element in the illumination beam path or imaging beam path is received by a detector;
determining the degree and the direction of polarization therefrom for different pixels of the detector; and
subjecting images to a polarization-dependent weighting of their intensity distribution and combining them to form a total image.

2. The method for emulation according to claim 1, wherein a quantity of images of the mask or sample are recorded, while a linear polarizer arranged in the illumination beam path or imaging beam path is rotated stepwise.

3. The method for emulation according to claim 1, wherein at least one image of the mask or sample is recorded for at least three angular positions of a polarizing optical element.

4. The method for emulation according to claim 1, wherein an unpolarized image of the mask or sample is recorded in addition or instead.

5. The method for emulation according to claim 1, wherein the images of the mask or sample are recorded at different distances from the focal plane with and without a polarizing optical element arranged in the illumination beam path or imaging beam path.

6. The method for emulation according to claim 5, wherein the image or images is/are recorded with polarizing optical elements in front of, in, or behind the focal plane, and the image is recorded without a polarizing optical element in front of or in or behind the focal plane.

7. The method for emulation according to claim 1, wherein the degree and direction of polarization is described for a plurality of pixels of the detector as a polarization matrix, Jones matrix, Jones vector or other polarization-optical description.

8. The method for emulation according to claim 1, wherein the determination of the polarization characteristics of the image and the determination of the degree and direction of polarization for different pixels of the detector can be dispensed with, assuming that the polarization characteristics of the image correspond to those of the illumination.

9. The method for emulation according to claim 1, wherein the images are subjected in a polarization-dependent manner to a weighting of their intensity distribution in that portions of the intensity of the image of the mask or sample are displaced by a determined amount in different directions as intensity function, wherein the division into different portions is carried out in a polarization-dependent manner.

10. The method for emulation according to claim 9, wherein at least two portions of the intensity are displaced in different directions, wherein the displacement directions lie at least partially parallel or perpendicular to the direction of polarization.

11. The method for emulation according to claim 9, wherein the division into different portions is carried out in a ratio of 1+g to 1−g, where g is the degree of linear polarization.

12. The method for emulation according to claim 9, wherein the images are subjected in a polarization-dependent manner to a weighting of their intensity distribution in that the image of the mask or sample as intensity function is displaced in the direction of the determined polarization direction by an amount ±D on the one hand and perpendicular to the determined polarization direction by an amount ±D on the other hand, wherein D is the amount of the displacement of the image.

13. The method for emulation according to claim 12, wherein the amount D corresponds to the condition:

$$D = \frac{\lambda}{n_{Lack} 4\sqrt{2}} \cdot \frac{NA/n_{Lack}/\arcsin(NA/n_{Lack})}{1/\sqrt{2}/\arcsin(1/\sqrt{2})},$$

where c is a constant $\leq 1$.

14. The method for emulation according to claim 9, wherein the images of the mask or sample in positions (x+D, y), (x−D, y), (x, y+D) and (x, y−D) are summed with or without weighting, where x and y are two determined directions or any directions orthogonal to one another, wherein D is the amount of the displacement of the image.

15. The method for emulation according to claim 1, wherein, proceeding from the image, this image is modified by following the alternative route of pupil distribution or reconstruction thereof, or a convolution with a suitable point image, the difference of the point image of the image-side high-aperture and low-aperture system.

16. The method for emulation according to claim 15, wherein the images are subjected in a polarization-dependent manner to a weighting of their intensity distribution in that a two-dimensional frequency component determination is carried out, a polarization-dependent attenuation factor is calculated, and a two-dimensional image reconstruction is carried out for all elements of the Jones vector, Stokes vector or polarization matrix, the images measured with different polarizing optical elements in the illumination beam path or imaging beam path, or another polarization-optical description of the image for different pixels of the detector.

17. The method for emulation according to claim 15, wherein the weighting is carried out by a convolution of a suitable function in real space instead of by multiplication by an attenuation function in frequency space, wherein the transform of the attenuation function in the image space is a suitable function.

18. The method for emulation according to claim 15, wherein the polarization-dependent attenuation factor is determined by the angle between the spatial frequency vector and the polarization direction or the amount of the spatial frequency vector.

19. The method for emulation according to claim 18, wherein the polarization-dependent attenuation factor is calculated from, among others, the cosine of the angle enclosed by the three-dimensional E field vector in the image space of the high-aperture system.

20. The method for emulation according to claim 15, wherein when there is more than one possible value of the attenuation factor a weighted or unweighted average, the median, the mean value between the smallest and largest value, or some other value within the possible area of variation is formed.

21. The method for emulation according to claim 20, wherein the weighting function is formed by taking into account the characteristics or the polarization of the illumination.

22. The method for emulation according to claim 15, wherein partially polarized frequency components are split into a plurality of differently polarized portions and the attenuation factor is calculated individually for the portions.

23. The method for emulation according to claim 22, wherein these portions are preferably polarized parallel or perpendicular to the polarization direction.

24. The method for emulation according to claim 15, wherein partially polarized frequency components are divided into a polarized portion and an unpolarized portion, the unpolarized portion is considered to be 50% x-polarized and 50% y-polarized, where x and y are two determined directions or any directions orthogonal to one another and the polarization-dependent attenuation factor is calculated individually for each of the three portions.

25. The method for emulation according to claim 15, wherein the images of the mask or sample with and without a polarizing optical element arranged in the illumination beam path or imaging beam path are calculated together in the frequency space.

26. The method for emulation according to claim 25, wherein a total image is formed by image reconstruction of at least one component of the polarization-optical description or the total intensity.

27. The method for emulation according to claim 15, wherein an optimization algorithm, a recursive optimization algorithm, is used for reconstructing the pupil distribution which can then be used for calculating and taking into account the vector effect.

28. The method for emulation according to claim 1, wherein the images are subjected in a polarization-dependent manner to a weighting of their intensity distribution in that the image of the mask or sample is subjected to a spatial convolution with a normalized point image for a plurality of pixels of the detector.

29. The method for emulation according to claim 28, wherein the inverse convolution of the high-aperture point image with the point image of the inspection microscope is used as normalized point image.

30. The method for emulation according to claim 28, wherein the spatial convolution of the image of the mask or sample for a plurality of pixels of the detector with the normalized point image is carried out separately for different polarized beam components.

31. The method for emulation according to claim 28, wherein the spatial convolution of the image of the mask or sample with a normalized point image is carried out for at least two portions of the intensity of the image, wherein the division into the different portions is carried out in a polarization-dependent manner and a portion lies at least partially parallel to or perpendicular to the direction of polarization.

32. The method for emulation according to claim 28, wherein the division into the different portions is carried out in a ratio of 1+g to 1−g, where g is the degree of polarization.

33. The method for emulation according to claim 1, wherein images of the mask or sample for differently polarized beam components are combined by the evaluating unit by summing the intensity distributions to form a total image, wherein images for differently polarized beam components may have been subjected beforehand to a weighting of the intensity distribution.

34. The method for emulation according to claim 33, wherein the evaluation of the images is carried out by taking into account the polarization characteristics and vector effects are taken into account at least partially.

* * * * *